United States Patent
Takebayashi et al.

(10) Patent No.: US 8,343,277 B2
(45) Date of Patent: Jan. 1, 2013

(54) SUBSTRATE PROCESSING APPARATUS (75) Inventors: Yuji Takebayashi, Toyama (JP); Satoshi Okada, Toyama (JP); Takashi Nakagawa, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 285 days.

(21) Appl. No.: 12/710,549

(22) Filed: Feb. 23, 2010

(65) Prior Publication Data
US 2010/0212593 A1 Aug. 26, 2010

(30) Foreign Application Priority Data
Feb. 23, 2009 (JP) ................. 2009-039906

(51) Int. Cl.
C23C 16/455 (2006.01)
C23C 16/46 (2006.01)
C23F 1/00 (2006.01)
H01L 21/306 (2006.01)
C23C 16/06 (2006.01)
C23C 16/22 (2006.01)

(52) U.S. Cl. .............. 118/715; 156/345.29; 156/345.37; 118/724

(58) Field of Classification Search .............. 118/715, 118/724; 156/345.29, 345.37
See application file for complete search history.

(56) References Cited

U.S. PATENT DOCUMENTS

| 5,307,568 | A | * | 5/1994 | Matsuo et al. ............ 34/92 |
| 5,863,467 | A | | 1/1999 | Mariner et al. |
| 7,547,003 | B2 | * | 6/2009 | Okabe et al. ............ 261/78.2 |

FOREIGN PATENT DOCUMENTS

| JP | 05068865 A | * | 3/1993 |
| JP | A-8-97154 | | 4/1996 |
| JP | A-11-1621 | | 1/1999 |
| JP | 2010199160 A | * | 9/2010 |

OTHER PUBLICATIONS

Korean Office Action issued in Korean Patent Application No. 10-2010-0016250 dated Jul. 21, 2011 (with translation).
Aug. 3, 2012 Office Action issued in Chinese Patent Application No. 201010118246.0 w/translation.

* cited by examiner

Primary Examiner — Rudy Zervigon
(74) Attorney, Agent, or Firm — Oliff & Berridge, PLC (57) ABSTRACT

To inhibit a diffusion of particles into a processing chamber and reduce a cost required for exchanging a gas filter. A substrate processing apparatus comprises: a processing chamber processing substrates; a gas supply part supplying processing gas into the processing chamber; wherein the gas supply part has a gas supply nozzle disposed in the processing chamber; a filter removing impurities contained in the processing gas; and a gas supply port opened in the gas supply nozzle, for supplying into the processing chamber the processing gas from which impurities are removed by the filter.

12 Claims, 7 Drawing Sheets

SUBSTRATE PROCESSING APPARATUS

BACKGROUND

1. Technical Field

The present invention relates to a substrate processing apparatus processing substrates.

2. Description of Related Art

As higher density tendency is progressed, in a semiconductor device such as DRAM, for example, a high dielectric constant film (High-k film) containing hafnium (Hf) element and zirconium (Zr) element has been used, as a gate insulating film and a capacitor insulating film. For example, this is because a $HfO_2$ film having a film thickness of 1.6 nm can have a high dielectric constant equivalent to that of a $SiO_2$ film having a film thickness of 4.5 nm. As a method of forming the high dielectric constant film containing Hf element and Zr element, for example an ALD (Atomic Layer Deposition) method has been used, for alternately supplying vaporized gas generated by vaporizing an organic compound (liquid source) such as TEMAH ($Hf[N(CH_3)CH_2CH_3]_4$:tetrakis methyl amino hafnium) and TEMAZ ($Zr[N(CH_3)CH_2CH_3]_4$:tetrakis ethyl methyl amino zirconium) by a vaporizer, and oxide gas such as ozone ($O_3$), into a processing chamber in which substrates such as silicon wafers are stored.

When the high dielectric constant film is formed by using the organic compound such as TEMAH and TEMAZ, carbide is remained in the vaporizer, or by-products including impurities of the vaporized gas, such as an oxide of the vaporized gas, are sometimes formed within a piping connecting inside of the vaporizer and inside of the processing chamber. Possibly, such carbide and oxide can be factors of generating particles (foreign matters), thereby deteriorating a production yield of the semiconductor device. Further, the organic compound such as TEMAH and TEMAZ are easy to react with moisture. Therefore, when purge of the inside of the vaporizer and the inside of the piping executed for removing moisture is insufficient after the vaporizer and the piping are exchanged, or when the vaporizer and the piping are unevenly heated, the moisture remained in the vaporizer and the piping and the organic compound are reacted, to thereby generate the particles in some cases.

In order to suppress diffusion of the particles generated in the vaporizer and the piping, into the processing chamber, in a conventional substrate processing apparatus, a filter is provided to the piping that connects the vaporizer and the processing chamber. However, with this structure, the inside of the vaporizer and the inside of the piping are exposed to the atmosphere when the filter is exchanged, and the moisture is adhered to inner walls thereof, resulting in the generation of the particles in some cases. A method of exchanging a part of a piping member exposed to the atmosphere during exchange of the filter can also be considered. However, this method involves a problem that the time required for an exchange work of the filter is increased and a cost is also increased. Particularly, it is sometimes also necessary to install/remove a heating heater provided to a periphery of the piping, when the piping member, etc, is exchanged, thus involving a problem that the time required for the exchange work of the filter is increased and the cost is also increased.

SUMMARY OF THE INVENTION

An object of the present invention is to provide a substrate processing apparatus capable of suppressing a diffusion of particles into a processing chamber, and reducing a cost required for an exchange of a filter.

According to a first aspect of the present invention, a substrate processing apparatus is provided, comprising:

a processing chamber processing substrates;

a gas supply part supplying processing gas into the processing chamber;

wherein the gas supply part has a gas supply nozzle disposed in the processing chamber; a filter disposed in the gas supply nozzle, for removing impurities contained in the processing gas; and a gas supply port for supplying into the processing chamber, the processing gas from which the impurities are removed by the filter.

According to the substrate processing apparatus of the present invention, the diffusion of the particles into the processing chamber is suppressed, and the cost required for exchanging the filter can be reduced.

BRIEF DESCRIPTION OF THE DRAWINGS

FIG. 2 is a schematic block diagram of a processing furnace provided to the substrate processing apparatus according to an embodiment of the present invention, wherein FIG. 2A shows a vertical sectional schematic view of a processing furnace, and FIG. 2B shows a cross-sectional schematic view of the processing furnace.

DESCRIPTION OF PREFERRED EMBODIMENT OF THE INVENTION

(1) Structure of a Substrate Processing Apparatus

First, a structural example of a substrate processing apparatus 101 according to an embodiment of the present invention will be described, by using FIG. 1.

Figure 1:
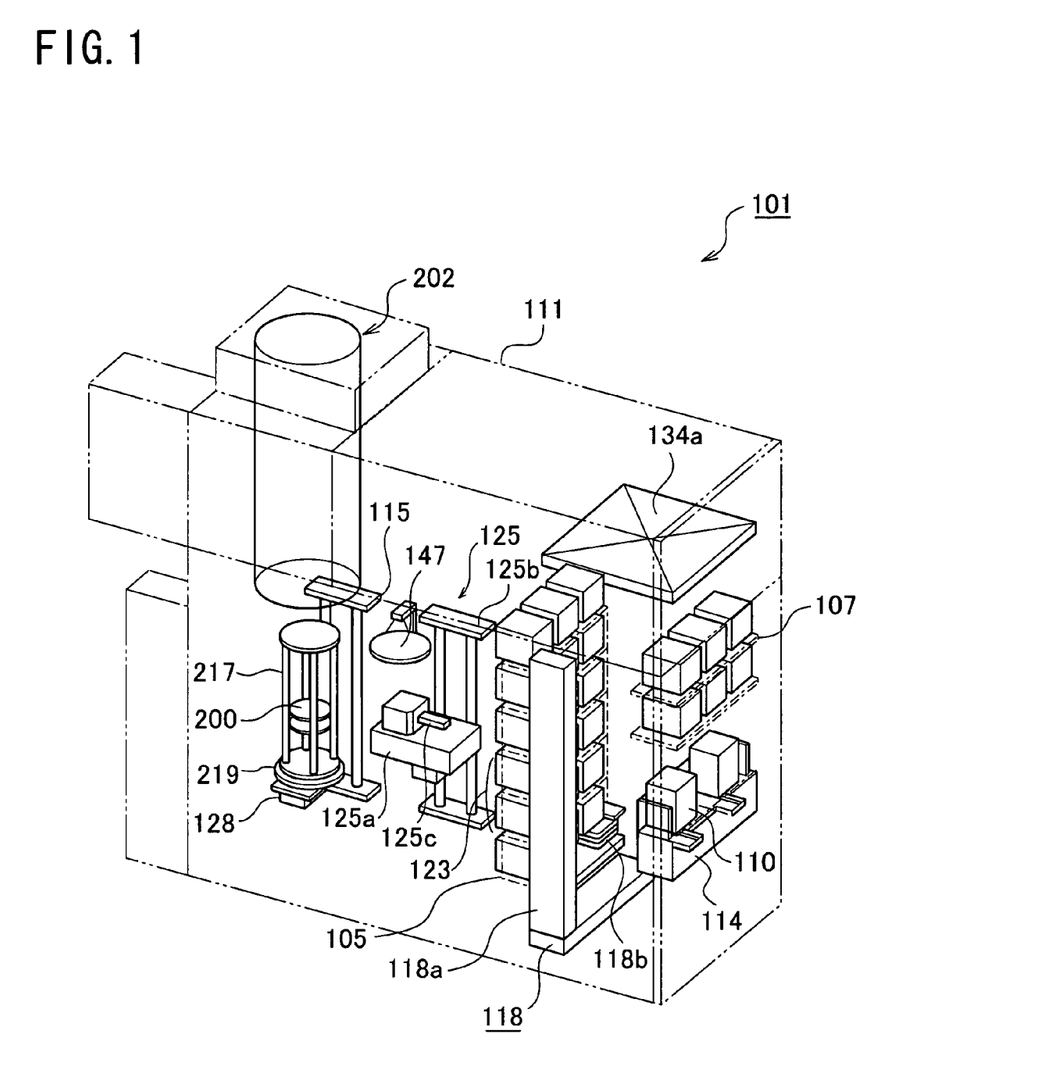
FIG. 1 is a schematic block diagram of a substrate processing apparatus according to an embodiment of the present invention.

As shown in FIG. 1, the substrate processing apparatus 101 according to this embodiment includes a casing 111. In order to carry a wafer (substrate) 200 configurated to silicon to inside/outside of the casing 111, a cassette 110 is used, being a wafer carrier (substrate storage container) for storing a plurality of wafers 200. A cassette stage (substrate storage container transfer stand) 114 is provided on the front side of the casing 111 (right side in the figure). The cassette 110 is placed on the cassette stage 114 by an in-step carrying device not shown, and is unloaded to outside of the casing 111 from the cassette stage 114.

The cassette 110 is placed on the cassette stage 114, so that the wafer 200 in the cassette 110 is set in a vertical posture, and a wafer charging/discharging port of the cassette 110 is faced upward. The cassette stage 114 is formed, so that the cassette 110 is rotated by 90° vertically backward of the casing 111, with the wafer 200 in the cassette 110 set in a horizontal posture, so that the wafer charging/discharging port of the cassette 110 can be faced backward of the casing 111.

A cassette rack (substrate storage container placement rack) 105 is installed in approximately a central part in a longitudinal direction of the casing 111. The cassette rack 105 is formed so that a plurality of cassettes 110 is stored in multiple stages and multiple rows. A transfer rack 123 in which the cassette 110, being a carrying object of a wafer transfer mechanism 12 as will be described later, is provided to the cassette rack 105. Further, a preliminary cassette rack 107 is provided above the cassette stage 114, so that the cassette 110 is stored preliminarily.

A cassette carrying device (substrate storage container carrying device) 118 is provided between the cassette stage 114 and the cassette rack 105. The cassette carrying device 118 includes a cassette elevator (substrate storage container elevating mechanism) capable of elevating the cassette 110 while holding the cassette 110, and a cassette carry mechanism (substrate storage container carry mechanism) 118b, being a carry mechanism capable of moving the cassette 110 horizontally while holding the cassette 110. By a cooperative operation of the cassette elevator 118a and the cassette carry mechanism 118b, the cassette 110 is carried among the cassette stage 114, the cassette rack 105, the preliminary cassette rack 107, and the transfer rack 123.

A wafer transfer mechanism (substrate transfer mechanism) 125 is provided back in the cassette rack 105. The wafer transfer mechanism 125 includes a wafer transfer device (substrate carrying device) 125a capable of horizontally rotating or linearly moving the wafer 200, and a wafer transfer device elevator (substrate carrying device elevating mechanism) 125b for elevating the wafer transfer device 125a. Note that the wafer transfer device 125a includes a tweezer (substrate carrying jig) for holding the wafer 200 in a horizontal posture. By the cooperative operation of the wafer transfer device 125a and the wafer transfer device elevator 125b, the wafer 200 is picked-up from the cassette 110 on the transfer rack 123, and is charged into a boat (substrate support member) 217 or is discharged from the boat 217, and is stored in the cassette 110 on the transfer rack 123.

A processing furnace 202 is provided to a rear upper part of the casing 111. An opening is formed on a lower end portion of the processing furnace 202, so that the opening is opened and closed by a furnace port shutter (furnace port open/close mechanism) 147. Note that a structure of the processing furnace 202 will be described later.

A boat elevator (substrate support member elevating mechanism) 115, being an elevating mechanism for carrying the boat 217 to inside/outside of the processing furnace 202 by elevating the boat 217, is provided to a lower part of the processing furnace 202. An arm 128, being a connecting tool, is provided on an elevation table of the boat elevator 115. A seal cap 219, being a lid member for vertically supporting the boat 217 and air-tightly closing the lower end portion of the processing furnace 202 when the boat 217 is elevated by the boat elevator 115, is provided on the arm 128 in a horizontal posture. A loading/unloading unit for loading and unloading at least one sheet of wafer 200 to inside/outside of the processing chamber 201 is mainly constituted of the wafer transfer mechanism 125 (wafer transfer device 125a, wafer transfer device elevator 125b, and tweezer 125c), boat elevator 115, and arm 128.

The boat 217 includes a plurality of holding members, and a plurality of sheets of wafers 200 (for example, about 50 to 150 sheets) are held in such a manner as to be vertically arranged in a horizontal posture, with centers thereof aligned, in multiple stages. A detailed structure of the boat 217 will be described later.

A clean unit 134a including a supply fan and a dust-proof filter is provided in an upper part of the cassette rack 105. The clean unit 134a is formed so that clean air, being a clean atmosphere, is flown into the casing 111.

Further, a clean unit (not shown) including the supply fan and the dust-proof filter for supplying clean air is installed at a left side end portion of the casing 111, on the opposite side to wafer transfer device elevator 125b and the boat elevator 115. The clean air blown out from the clean unit not shown is flown through the circumference of the wafer transfer device 125a and the boat 217, and thereafter sucked into an exhaust device not shown, and is exhausted to the outside of the casing 111.

(2) Operation of the Substrate Processing Apparatus

Next, the operation of the substrate processing apparatus 101 according to this embodiment will be described.

First, the cassette 110 is placed on the cassette stage 114 by an in-step carrying device not shown, so that the wafer 200 is set in a vertical posture and the wafer charging/discharging port of the cassette 110 is faced upward. Thereafter, the cassette 110 is rotated vertically by 90° backward of the casing 111, by the cassette stage 114. As a result, the wafer 200 in the cassette 110 is set in a horizontal posture, and the wafer charging/discharging port of the cassette 110 is faced backward of the casing 111.

The cassette 110 is automatically carried, transferred, and temporarily stored in a designated rack position of the cassette rack 105 or the preliminary cassette rack 107, and thereafter is transferred to the transfer rack 123 from the cassette rack 105 or the preliminary cassette rack 107, or is directly carried to the transfer rack 123.

When the cassette 110 is transferred to the transfer rack 123, the wafer 200 is picked-up from the cassette 110 through the wafer charging/discharging port by the tweezer 125c of the wafer transfer device 125a, and is charged into the boat 217 at a back of the transfer chamber 124 by the cooperative operation of the wafer transfer device 125a and the wafer transfer device elevator 125b. The wafer transfer mechanism 125 that transfers the wafer 200 to the boat 217, is returned to the cassette 110, so that the next wafer 200 is charged into the boat 217.

When the previously designated sheets of wafers 200 are charged into the boat 217, the lower end portion of the processing furnace 202 closed by the furnace port shutter 147 is opened by the furnace port shutter 147. Subsequently, by elevating the seal cap 219 by the boat elevator 115, the boat 217 holding a group of the wafers 200 is loaded into the processing furnace 202 (loading). After loading, arbitrary processing is applied to the wafer 200 by the processing furnace 202. Such processing will be described later. After processing, the wafer 200 and the cassette 110 are discharged to outside of the casing 111 in a reversed procedure to the aforementioned procedure.

(3) Structure of the Processing Furnace

Figure 2:
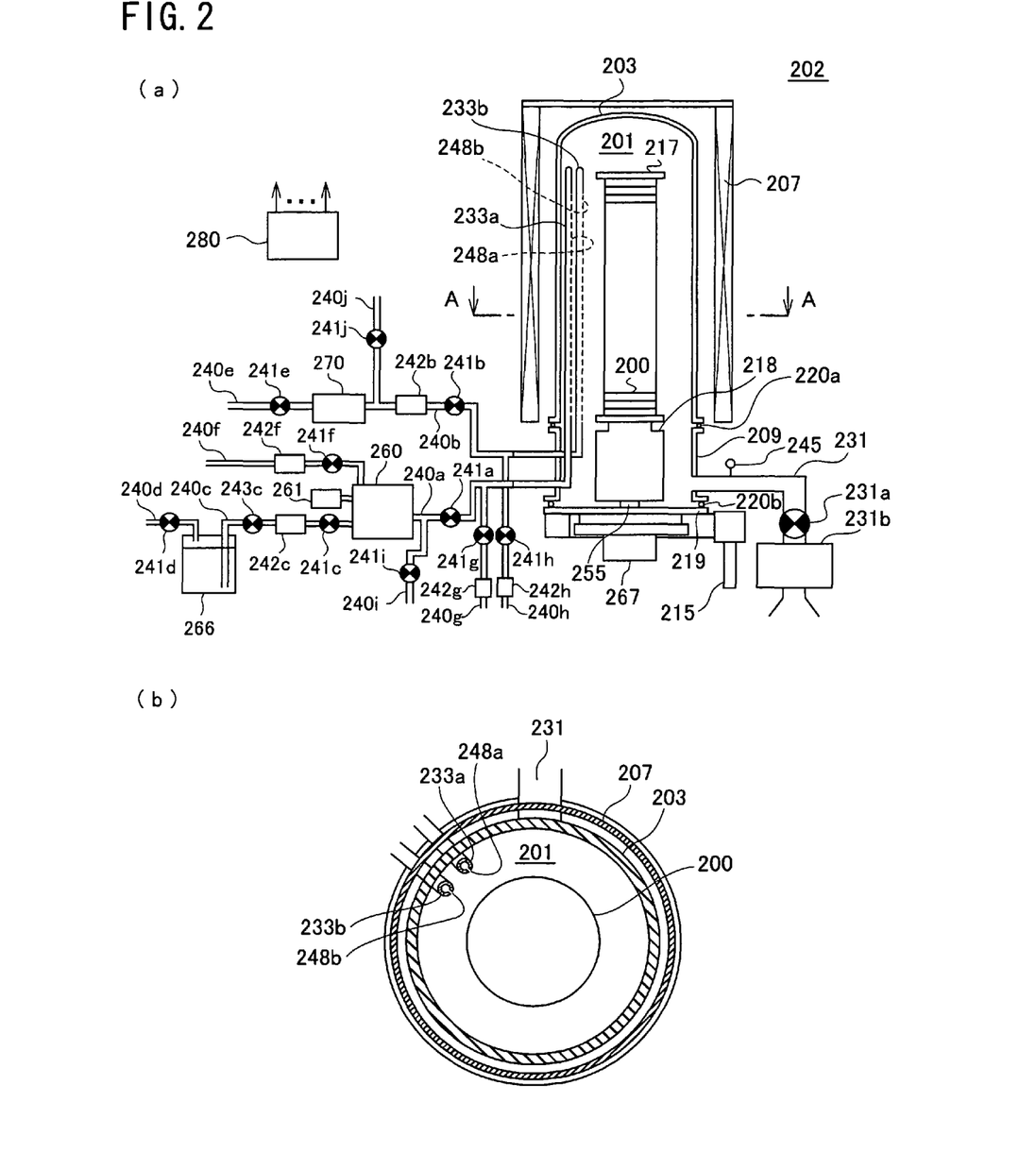

Subsequently, the structure of the processing furnace 202 according to an embodiment of the present invention will be described, with reference to the drawings. FIG. 2 is a schematic block diagram of the processing furnace 202 provided to the substrate processing apparatus according to an embodiment of the present invention, wherein FIG. 2A shows a vertical sectional schematic view of a processing furnace, and FIG. 2B shows a cross-sectional schematic view of the processing furnace 202, respectively.

(Processing Chamber)

The processing furnace 202 according to an embodiment of the present invention has a reaction tube 203 and a manifold 209. The reaction tube 203 is configured to a non-metal material having heat resistance property such as quartz (SiO2) and silicon carbide (SiC), and is formed into a cylindrical shape with an upper end portion closed and a lower end portion opened. The manifold 209 is configured to a metal material such as SUS, and is formed into a cylindrical shape with the upper end portion and the lower end portion opened. The reaction tube 203 is supported by the manifold 209 vertically from the lower end portion side. The reaction tube 203 and the manifold 209 are disposed concentrically. The lower end portion of the manifold 209 is air-tightly sealed by the seal cap 219 when the boat elevator 115 is elevated. A sealing member 220b such as an O-ring for air-tightly sealing the inside of the processing chamber 201 is provided between the lower end portion of the manifold 209 and the seal cap 219.

The processing chamber 201, in which wafers 200 are stored as substrates, is formed inside of the reaction tube 203 and the manifold 209. In the processing chamber 201, the boat 217, being a substrate holding tool, is inserted from below. Inner diameters of the reaction tube 203 and the manifold 209 are set to be greater than a maximum outer diameter of the boat 217 in which the wafers 200 are charged.

The boat 217 is constituted, so that a plurality of (for example, 75 to 100 sheets) wafers 200 are held in approximately a horizontal state at prescribed intervals (pitch intervals of the substrate) in multiple stages. The boat 217 is mounted on a heat insulating cap 218 that blocks heat conduction from the boat 217. The heat insulating cap 218 is supported by a rotary shaft 255 from below. The rotary shaft 255 is provided so as to pass through a central part of the seal cap 219, while holding air-tightness of the inside of the processing chamber 201. A rotating mechanism 267 for rotating the rotary shaft 255 is provided below the seal cap 219. By rotating the rotary shaft 255 by the rotating mechanism 267, the boat 217, on which a plurality of wafers 200 is mounted, can be rotated, while air-tightly holding the inside of the processing chamber 201.

A heater 207, being a heating part (heating mechanism), is provided on an outer periphery of the reaction tube 203 concentrically with the reaction tube 203. The heater 207 has a cylindrical shape, and is vertically installed by being supported by a heater base 207a, being a holding plate shown in FIG. 3. The heater 207 heats a processing area of the wafer 200 in the processing chamber 201, namely an area where the wafer 200 is held in multiple stages by the boat 217, at a prescribed film forming temperature (for example, at a temperature of decomposing vaporized gas as will be described later).

(Vaporized Gas Supply System)

A vaporized gas nozzle 233a is provided to the manifold 209. The vaporized gas nozzle 233a is formed into an L-shape having a vertical portion and a horizontal portion. The vertical portion of the vaporized gas nozzle 233a is disposed in a vertical direction along the inner wall of the reaction tube 203. A plurality of vaporized gas supply holes 248a, being gas supply openings for introducing the vaporized gas, being a processing gas, into the processing chamber 201, are formed in a vertical direction on a side face (cylinder portion) of the vertical portion of the vaporized gas nozzle 233a. Opening diameters of the vaporized gas supply holes 248a may be set to same extending from a lower part to an upper part, or may be gradually larger extending from the lower part to the upper part. The horizontal portion of the vaporized gas nozzle 233a is provided so as to pass through the side wall of the manifold 209.

A vaporized gas supply tube 240a for supplying the vaporized gas, being the processing gas, into the processing chamber 201, is connected to a horizontal end portion (upstream side) of the vaporized gas nozzle 233a protruded from the side wall of the manifold 209. A vaporizer 260 is connected to the upstream side of the vaporized gas supply tube 240a. The vaporizer 260 includes a pressure vessel not shown. An evaporation space heated to a prescribed temperature atmosphere is formed inside of the pressure vessel. Liquid source is supplied into the evaporation space. An energizing heating heater not shown for heating the evaporation space is provided on the outer periphery of the pressure vessel. When the evaporation space is heated to a prescribe temperature atmosphere by the energizing heating heater, the liquid source supplied into the evaporation space is vaporized, to thereby generate vaporized gas (source gas). An open/close valve 241a is provided to the vaporized gas supply tube 240a. By opening the open/close valve 241a, the vaporized gas generated by the vaporizer 260 is supplied into the processing chamber 201.

A liquid source supply tube 240c for supplying the liquid source into the evaporation space of the vaporizer 260, and a carrier gas supply tube 240f for supplying carrier gas into the evaporation space of the vaporizer 260 are respectively connected to the upstream side of the vaporizer 260.

The upstream side of the liquid source supply tube 240c is connected to a liquid source supply tank 266 for accumulating the organic compound such as TEMAH and TTEMAZ, being the liquid source. An upstream side end portion of the liquid source supply tube 240c is immersed into the liquid source accumulated in the liquid source supply tank 266. An open/close valve 243c, a liquid flow rate controller (LMFC) 242c, and an open/close valve 241c are provided to the liquid source supply tube 240c sequentially from the upstream side.

A pressurized gas supply tube 240d for supplying inactive gas such as He gas is connected to an upper surface of the liquid source supply tank 266. The upstream side of the pressurized gas supply tube 240d is connected to a pressurized gas supply source not shown for supplying the inactive gas such as He gas as the pressurized gas. An open/close valve 241d is formed in the pressurized gas supply tube 240d. The pressurized gas is supplied into the liquid source supply tank 266 by opening the open/close valve 241d, and further by opening the open/close valve 243c and the open/close valve 241c, the liquid source in the liquid source supply tank 266 is sent (supplied) to the vaporizer 260 under pressure. Note that supply flow rate (namely, flow rate of the vaporized gas generated by the vaporizer 260 and supplied into the processing chamber 201) of the liquid source to the vaporizer 260 can be controlled by a liquid flow rate controller 242c.

The upstream side of the carrier gas supply tube 240f is connected to a carrier gas supply source not shown for supplying the inactive gas such as helium (He), neon (Ne), argon (Ar), nitrogen ($N_2$), being carrier gas. A flow rate controller (MFC) 242f and an open/close valve 241f are provided to the carrier gas supply tube 240f, sequentially from the upstream side. By opening the open/close valve 241f and the open/close valve 241a, the carrier gas is supplied into the vaporizer 260, and mixed gas of the vaporized gas and the carrier gas is supplied into the processing chamber 201 through the vaporized gas supply tube 240a. By supplying the carrier gas into the vaporizer 260, discharge of the vaporized gas from the vaporizer 260 and supply of the vaporized gas into the processing chamber 201 can be prompted. Supply flow rate of the carrier gas into the vaporizer 260 (namely, supply flow rate of the carrier gas into the processing chamber 201) can be controlled by the flow rate controller 242f. Note that in this embodiment, even when the liquid source is not supplied into the vaporizer 260 (when the vaporized gas is not generated), a constant amount of carrier gas can be always supplied into the vaporizer 260.

A vaporized gas supply system of this embodiment is mainly constituted of the vaporized gas nozzle 233a, vaporized gas supply hole 248a, vaporized gas supply tube 240a, vaporizer 260, open/close valve 241a, liquid source supply tube 240c, carrier gas supply tube 240f, liquid source supply tank 266, open/close valve 243c, liquid flow rate controller 242c, open/close valve 241c, pressurized gas supply tube 240d, pressurized gas supply source not shown, open/close valve 241d, carrier gas supply source not shown, flow rate controller 242f, and open/close valve 241f.

(Reactive Gas Supply System)

A reactive gas nozzle 233b is provided to the manifold 209. The reactive gas nozzle 233b is formed into an L-shape having a vertical portion and a horizontal portion. The vertical portion of the reactive gas nozzle 233b is arranged in a vertical direction along an inner wall of the reaction tube 203. A plurality of reactive gas supply holes 248b are provided vertically on a side face of the vertical portion of the reactive gas nozzle 233b. An opening diameter of each reactive gas supply hole 248b may be set to be same extending from the lower part to the upper part, or may be gradually larger extending from the lower part to the upper part. The horizontal portion of the reactive gas nozzle 233b is provided so as to pass through a side wall of the manifold 209.

The reactive gas supply tube 240b for supplying reactive gas into the processing chamber 201, is connected to a horizontal end portion (upstream side) of the reactive gas nozzle 233b protruded from the side wall of the manifold 209. An ozonizer 270 generating ozone ($O_3$) gas (oxide gas), being the reactive gas, is connected to the upstream side of the reactive gas supply tube 240b as a reactive gas supply system. The flow rate controller (MFC) 242b and the open/close valve 241b are provided to the reactive gas supply tube 240b, sequentially from the upstream side. An oxygen gas supply tube 240e is connected to the ozonizer 270. The upstream side of the oxygen gas supply tube 240e is connected to an oxygen gas supply source not shown for supplying oxygen ($O_2$) gas. An open/close valve 241e is provided to the oxygen gas supply tube 240e. Oxygen gas is supplied to the ozonizer 270 by opening the open/close valve 241e, and the ozone gas generated by the ozonizer 270 by opening the open/close valve 241b is supplied into the processing chamber 201 through the reactive gas supply tube 240b. Note that the supply flow rate of the ozone gas into the processing chamber 201 can be controlled by the flow rate controller 242b.

The reactive gas supply system of this embodiment is mainly constituted of the reactive gas nozzle 233b, reactive gas supply hole 248b, reactive gas supply tube 240b, ozonizer 270, flow rate controller 242b, open/close valve 241b, oxygen gas supply tube 240e, oxygen gas supply source not shown, and open/close valve 241e.

(Vent Tube)

The upstream side of a vaporized gas vent tube 240i is connected between the vaporizer 260 and the open/close valve 241a in the vaporized gas supply tube 240a. The downstream side of the vaporized gas vent tube 240i is connected to the downstream side of the exhaust tube 231 as will be described later (between an APC valve 231a and a vacuum pump 231b as will be described later). An open/close valve 241i is provided to the vaporized gas vent tube 240i. By closing the open/close valve 241a and opening the open/close valve 241i, supply of the vaporized gas into the processing chamber 201 can be stopped, while generation of the vaporized gas in the vaporizer 260 is continued. Although a prescribed time is required for stably generating the vaporized gas, supply/stop of the vaporized gas into the processing chamber 201 can be switched in a short time, by a switching operation of the open/close valve 241a and the open/close valve 241i.

Similarly, the upstream side of the reactive gas vent tube 240j is connected between the ozonizer 270 and the flow rate controller 242b in the reactive gas supply tube 240b. The downstream side of the reactive gas vent tube 240j is connected to the downstream side of the exhaust tube 231 (between the APC valve 231a and the vacuum pump 231b). The open/close valve 241j is provided to the reactive gas vent tube 240j. By closing the open/close valve 241b and opening the open/close valve 241j, supply of the ozone gas into the processing chamber 201 can be stopped, while generation of the ozone gas by the ozonizer 270 is continued. Although a prescribed time is required for stably generating the ozone gas, supply/stop of the ozone gas into the processing chamber 201 can be switched in a short time, by the switching operation of the open/close valve 241b and the open/close valve 241j.

(Purge Gas Supply Tube)

The downstream side of the open/close valve 241a in the vaporized gas supply tube 240a is connected to the downstream side of a first purge gas tube 240g. A purge gas supply source not shown for supplying inactive gas such as $N_2$ gas, a flow rate controller (MFC) 242g, and an open/close valve 241g are provided to the first purge gas tube 240g, sequentially from the upstream side. By closing the open/close valve 241a and opening the open/close valve 241i and opening the open/close valve 241g, supply of the vaporized gas into the processing chamber 201 can be stopped while generation of the vaporized gas is continued, and also supply of the purge gas into the processing chamber 201 can be started. By supplying the purge gas into the processing chamber 201, discharge of the vaporized gas from the processing chamber 201 can be prompted.

Similarly, the downstream side of a second purge gas tube 240h is connected to the downstream side of the open/close valve 241b in the reactive gas supply tube 240b. The purge gas supply source not shown for supplying the inactive gas such as $N_2$ gas, a flow rate controller (MFC) 242h, and an open/close valve 241h are provided to the second purge gas tube 240h sequentially from the upstream side. By closing the open/close valve 241b and opening the open/close valve 241j and opening the open/close valve 241h, supply of the ozone gas into the processing chamber 201 can be stopped and also supply of the purge gas into the processing chamber 201 can be started while generation of the ozone gas is continued. Discharge of the ozone gas from the processing chamber 201 can be prompted, by supplying the purge gas into the processing chamber 201.

(Exhaust System)

The exhaust tube 231 for exhausting an atmosphere in the processing chamber 201 is connected to the side wall of the manifold 209. A pressure sensor 245, being a pressure detector, an APC (Auto Pressure Controller valve 231a, being a pressure adjuster, and a vacuum pump 231b, being a vacuum exhaust device, are provided to the exhaust tube 231, sequentially from the upstream side. By adjusting an opening degree of the open/close valve of the APC valve 231a, while operating the vacuum pump 231b, the inside of the processing chamber 201 can be set to a prescribed pressure. An exhaust system of this embodiment is mainly constituted of the exhaust tube 231, pressure sensor 245, APC valve 231a, and vacuum pump 231b.

(Seal Cap)

A seal cap 219, being a furnace port lid member capable of air-tightly closing a lower end opening of the manifold 209 is provided to a lower side of the manifold 209. The seal cap 219 is abutted on the lower end of the manifold 209 from the lower side in a vertical direction. The seal cap 219 is configurated to metal such as stainless, and is formed into a disc shape. An O-ring 220b, being a seal member abutted on the lower end of the manifold 209, is provided to the upper surface of the seal cap 219. A rotating mechanism 267 for rotating the boat 217 is installed on the opposite side to the processing chamber 201 across the seal cap 219. The rotary shaft 255 of the rotating mechanism 267 is passed through the seal cap 219, and the boat 217 is thereby supported from under, so that the wafer 200 can be rotated by operating the rotating mechanism 267. The seal cap 219 is vertically elevated by a boat elevator 215, being an elevating mechanism, disposed vertically outside of the reaction tube 203, thus making it possible to carry the boat 217 to inside/outside of the processing chamber 201.

(Controller)

A controller 280, being a control part (control means) is connected to the heater 207, APC valve 231a, vacuum pump 231b, rotating mechanism 267, boat elevator 215, energizing heating heater 264, open/close valves 241a, 241b, 242c, 243c, 241d, 241e, 241f, 241g, 241h, 241i, 241j, liquid flow rate controller 242c, and flow rate controllers 242b, 242f, 242g, 242h, etc. The controller 280 controls temperature adjustment operation of the heater 207, opening/closing and pressure adjustment of the APC valve 231a, start/stop of the vacuum pump 231b, rotation speed adjustment of the rotating mechanism 267, elevating operation of the boat elevator 215, opening/closing operation of the open/close valves 241a, 241b, 242c, 243c, 241d, 241e, 241f, 241g, 241h, 241i, and 241j, and flow rate adjustment by the liquid flow rate controller 242c, and the flow rate controllers 242b, 242f, 242g, and 242h.

(4) Gas Supply Part

Subsequently, the structure of a gas supply part of this embodiment will be described, with reference to the drawings.

Figure 3:
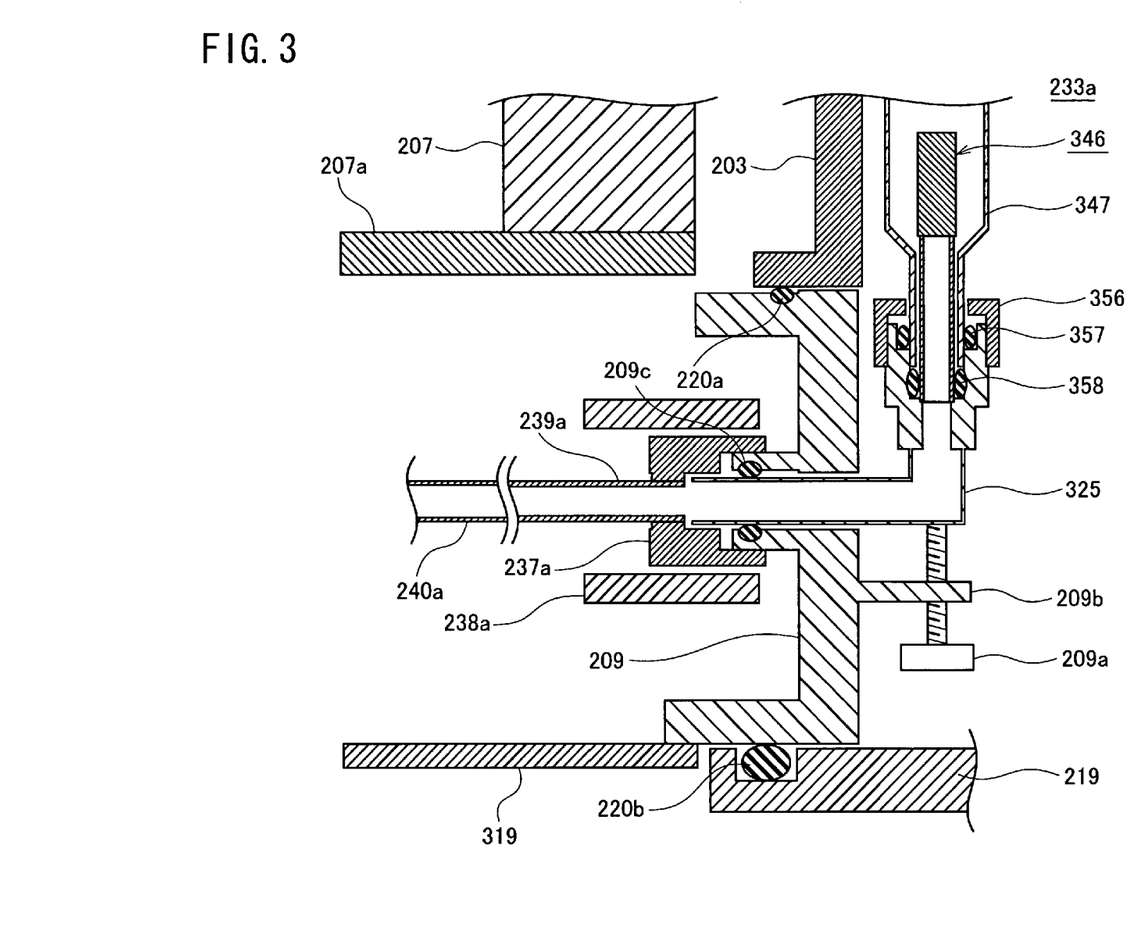
FIG. 3 is a partial expanded view of a vaporized gas nozzle and its periphery according to an embodiment of the present invention.
Figure 4:
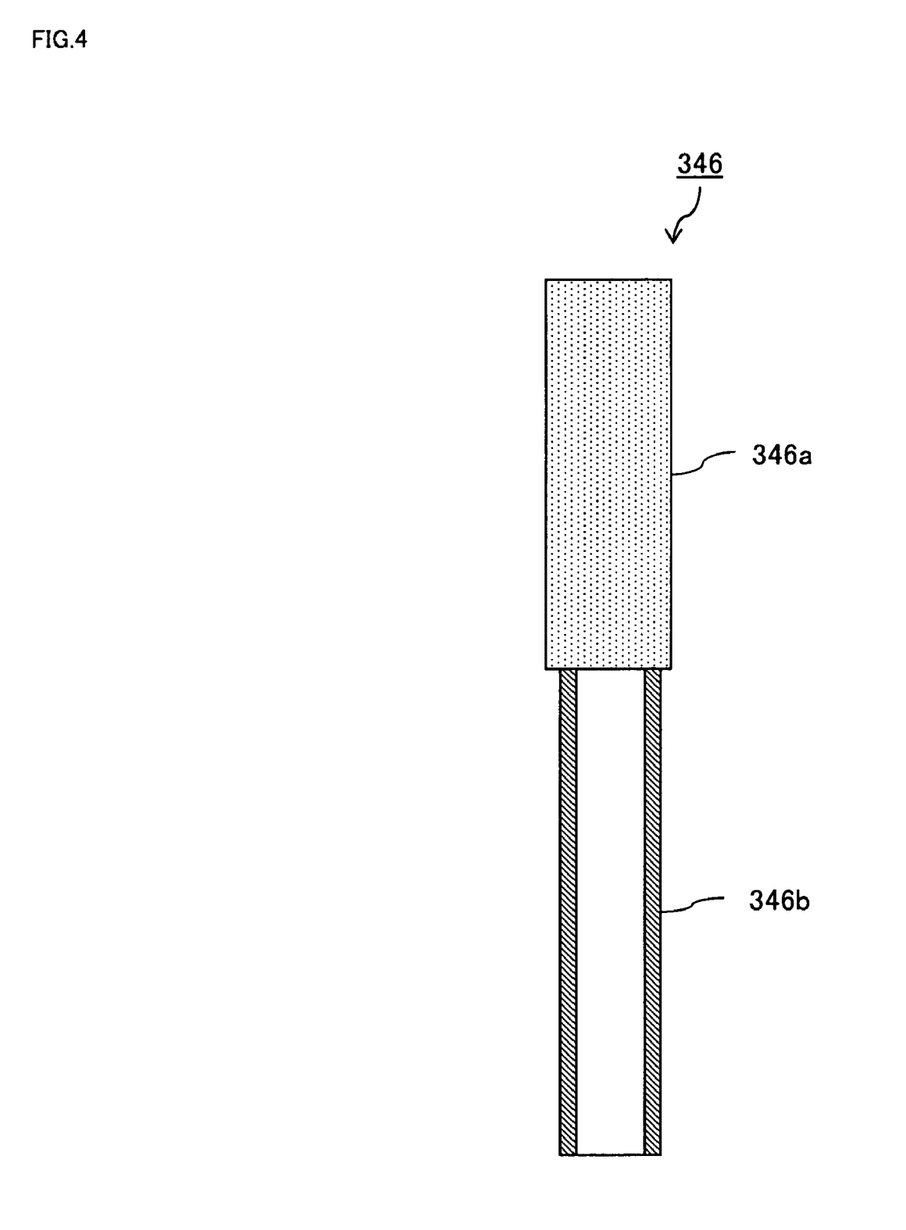
FIG. 4 is a schematic block diagram of a filter according to an embodiment of the present invention.

FIG. 3 is a partial expanded view of the vaporized gas nozzle 233a and its periphery according to an embodiment of the present invention, and FIG. 4 is a schematic block diagram of the filter according to an embodiment of the present invention.

As shown in FIG. 3, the vaporized gas nozzle 233a, being the gas supply nozzle, has a gas introducing nozzle 325 disposed in the processing chamber 201, and a gas rectifier nozzle 347 connected to a tip end (namely a downstream end) of a gas introducing nozzle 325. The gas introducing nozzle 325 is passed through the side wall of the manifold 209 in a horizontal posture, and constitutes the horizontal portion of the vaporized gas nozzle 233a. An O-ring 209c is provided between the gas introducing nozzle 325 and the side wall of the manifold 209, so that air-tightness of the inside of the processing chamber 201 can be secured. The upstream side of the gas introducing nozzle 325 is protruded to the outside of the side wall of the manifold 209, and is air-tightly engaged with a joint part 237a provided to the downstream end 239a of the vaporized gas supply tube 240a. The downstream end of the gas introducing nozzle 325 is bent toward a vertical upper side in the processing chamber 201. The upstream end of the gas rectifier nozzle 347 is air-tightly connected to the downstream end of the gas introducing nozzle 325 via the O-ring 357. The gas rectifier nozzle 347 is fixed to the gas introducing nozzle 325 by fastening a fastening cap 356 provided so as to surround the outer periphery of the downstream end of the gas introducing nozzle 325. Thus, a connection part between the gas introducing nozzle 325 and the gas rectifier nozzle 347 is provided in the processing chamber 201. The gas rectifier nozzle 347 is arranged in the vertical direction along the inner wall of the reaction tube 203, and constitutes the vertical portion of the vaporized gas nozzle 233a. The upper end of the gas rectifier nozzle 347 is closed, and a plurality of vaporized gas supply holes 248a are provided in a cylinder portion of the gas rectifier nozzle 347 in the vertical direction.

A piping heater 238a is provided on the upstream side of the gas introducing nozzle 325 and the outer periphery of the vaporized gas supply tube 240a. The piping heater 238a heats the upstream side of the gas introducing nozzle 325, being a supply route of the vaporized gas, and the inside of the vaporized gas supply tube 240a, to not less than a prescribed temperature, respectively, to thereby inhibit reliquefaction of the vaporized gas. Further, a nozzle inclination adjustment mechanism including a seat 209b provided to the inner wall of the manifold 209, and an inclination adjustment screw 209a vertically passing through a screw hole provided to the seat 209b, is provided to the lower side of the bent portion of the gas introducing nozzle 325. By adjusting a height of the inclination adjustment screw 209a and making its upper end abut on the bent portion of the gas introducing nozzle 325 from under, an inclination of the gas rectifier nozzle 347 (distance between the vaporized gas supply hole 248a and the wafer 200) can be adjusted.

A filter 346 for removing impurities such as carbide and oxide is provided to the connection part between the gas introducing nozzle 325 and the gas rectifier nozzle 347, being the inside of the upstream side tip end portion of the gas rectifier nozzle 347. Namely, the gas rectifier nozzle 347 includes a hollow part with large flow passage sectional area in the upstream side tip end portion, and includes the filter 346 in such a hollow part. As shown in FIG. 4, the filter 346 includes a metal cylindrical part 346, being a cylindrically formed portion, and a cylindrical filter member 346a air-tightly connected to the upper end of the metal cylindrical part 346b. The filter member 346a can be configurated to stainless alloy having similar properties as SUS 316L and nickel (Ni) alloy, high purity nickel, etc, having similar properties as HASTELLOY (registered trademark) C22. An inner diameter of the gas rectifier nozzle 347 is set to be greater than a maximum outer diameter of the filter 346. The lower end of the filter 346 (lower end outer periphery of the metal cylindrical part 346b) is air-tightly connected to the downstream end inner periphery of the gas rectifier nozzle 347 via the O-ring 358. Thus, the tip end portion of the gas rectifier nozzle 347 is formed as an attachment port of the filter 346. Therefore, attachment or positioning of the filter 346 can be easily performed with good reproducibility.

Note that in order to reduce a flowing resistance of the vaporized gas between the inner wall of the gas rectifier nozzle 347 and the outer wall of the filter 346, and supply the vaporized gas smoothly into the processing chamber 201, the inner diameter of the gas rectifier nozzle 347 is preferably set to be greater than the maximum outer diameter of the filter 346 by for example 3 mm or more. Further, preferably a surface area (or volume) of the filter is suitably adjusted by adjusting a length and a diameter of the filter member 346a, depending on the supply flow rate of the vaporized gas into the processing chamber 201. For example, when the supply flow rate of the vaporized gas is increased, preferably the length and the diameter of the filter member 346a is increased, to thereby secure the surface area (or volume) of the filter.

The vaporized gas supplied from the gas introducing nozzle 325 is supplied into the metal cylindrical part 346b of the filter 346, and is supplied into the gas rectifier nozzle 347 through the inside of the filter member 346a, and thereafter is supplied into the processing chamber 201 from the vaporized gas supply hole 248a. At this time, the impurities such as carbide and oxide generated in the vaporizer 260 and the vaporized gas supply tube 240a are trapped by the filter 346 (filter member 346a), to thereby inhibit the diffusion of the particles into the processing chamber 201.

Thus, according to this embodiment, the metal cylindrical part 346b and the filter member 346a are provided inside of the gas rectifier nozzle 347, so that the surface of the filter member 346a is not directly exposed in the processing chamber 201. Thus, when the film forming step (S30) as will be described later is executed, formation of a thin film on the surface of the filter member 346a can be inhibited, and generation of the particles and clogging of the filter member 346a can be inhibited.

Further, according to this embodiment, a gap is formed between the vaporized gas supply hole 248a formed on the cylindrical part of the gas rectifier nozzle 347, and the filter member 346a. Specifically, the filter member 346a is disposed lower than an area where the vaporized gas supply hole 248a is opened. Thus, the surface of the filter member 346a can be prevented from being brought into contact with the atmosphere in the processing chamber 201. Then, when the film forming step (S30) as will be described later is executed, the formation of the thin film on the surface of the filter member 346a can be inhibited, thus making it possible to inhibit the generation of the particles and the clogging of the filter member 346a.

Further, according to this embodiment, the filter member 346a is disposed outside of a processing area of the wafer 200 in the processing chamber 201 (area in which the wafer 200 is held by the boat 217), lower than the processing area specifically. As described above, the heater 207 heats the processing area of the wafer 200 in the processing chamber 201 to a film forming temperature (for example, temperature for thermally decomposing the vaporized gas). According to this embodiment, by disposing the filter member 346a lower than the processing area (namely, in the upstream tip end of the gas rectifier nozzle 347), the temperature of the filter member 346a can be set lower than the temperature of thermally decomposing the vaporized gas, during execution of the film forming step (S30) as will be described later. Thus, thermal decomposition of the vaporized gas supplied to the filter member 346a can be inhibited and the clogging of the filter member 346a can be inhibited, thus making it possible to realize a longer service life of the filter member 346a. In addition, by disposing the filter member 346a at a position where the temperature is not less than a vapor pressure temperature of the vaporized gas, the reliquefaction of the vaporized gas can be inhibited. For example, when the vaporized gas generated by vaporizing the TEMAZ and TEMAH is used as the processing gas, the filter member 346a is disposed at a position where the temperature is not more than the temperature (for example 160° C.) for starting the thermal decomposition of the vaporized gas, being the temperature not less than the vapor pressure temperature (for example 130° C.) of the vaporized gas. In addition, according to this embodiment, an exclusive heating device, etc, is not required to prevent the reliquefaction, and therefore no space is needed around the gas rectifier nozzle 347, and an increase of the constituent components of the substrate processing apparatus can be suppressed.

With this structure, the clogging of the filter member 346a is inhibited. However, by repeatedly executing the film forming step (S30) as will be described later, the clogging occurs gradually in the filter member 346a in some cases. When the clogging occurs in the filter member 346a, there is a possibility that the flow rate of the vaporized gas supplied into the processing chamber 201 is reduced. Therefore, the filter 346 is preferably exchanged regularly. In this embodiment, the connection part between the gas introducing nozzle and the gas rectifier nozzle 347 is formed in the processing chamber 201, and therefore exchange of the filter 346 can be performed in the processing chamber 201. Namely, the seal cap 219 is descended, with the open/close valve 241a closed, and the fastening cap 356 is loosened to pull out the gas rectifier nozzle 347 from the gas introducing nozzle 325 and the filter 346 is exposed, to thereby make it easy to exchange the filter 346 in the processing chamber 201. By performing the exchange of the filter 346 in the processing chamber 201, inside of the vaporized gas supply route (inside of the upstream end of the gas introducing nozzle 325 and inside of the vaporized gas supply tube 240a) can be prevented from being exposed to the atmosphere, then adhesion of moisture to the inner walls thereof can be inhibited, and the generation of the particles can be inhibited. Further, simultaneously with the exchange of the filter 346, the exchange of the piping member constituting the vaporized gas supply system and installation/removal of the piping heater 238a can be eliminated, thus shortening the time required for the exchange work of the filter 346 and reducing the cost required for the exchange. In addition, by continuously purging the inside of the processing chamber 201 with inactive gas in the exchange work of the filter 346, invasion of the atmosphere into the vaporized gas supply route can be further effectively inhibited.

The gas supply part of this embodiment is mainly constituted of the vaporized gas nozzle 233a (the gas introducing nozzle 325, gas rectifier nozzle 347, vaporized gas supply hole 248a, fastening cap 356, O-rings 357, 358), filter 346 (metal cylindrical part 346b and filter member 346a), joint part 237a, O-ring 209c, piping heater 238a, pedestal 209b, and inclination adjustment screw 209a.

(5) Substrate Processing Step

Subsequently, the substrate processing step according to an embodiment of the present invention will be described. Note that in the substrate processing apparatus according to this embodiment, a method of forming a high dielectric constant film on the surface of the wafer 200 by using the ALD method, being one of the CVD (Chemical Vapor Deposition) methods, is used and executed as one step of the manufacturing steps of the semiconductor device. Note that in the description hereafter, the operation of each part constituting the substrate processing apparatus is controlled by the controller 280.
(Substrate Loading Step (S10))

First, a plurality of wafers 200 are charged into the boat 217 (wafer charge). Then, the boat 217 with the plurality of wafers 200 held therein is elevated by the boat elevator 215 and is loaded into the processing chamber 201 (boat loading). In this state, the lower end of the manifold 209 is set in a state of being sealed through the O-ring 220b. In the substrate loading step (S10), the open/close valve 241g and the open/close valve 241h are opened, to supply the purge gas continuously into the gas introducing nozzle 325, the gas rectifier nozzle 347, and the processing chamber 201. Thus, invasion of the atmosphere into the processing chamber 201 can be effectively inhibited. Further, the atmosphere in the processing chamber 201 and the atmosphere that invades into the processing chamber 201 are prevented from flowing backward into the gas rectifier nozzle 347, the gas introducing nozzle 325, and the vaporized gas supply tube 240a through the vaporized gas supply hole 248a. Then, contamination of the filter member 346a can be inhibited, and the generation of the particles and the clogging of the filter member 346a can be inhibited. Further, deterioration of the filter member 346a can be inhibited, and a long service life of the filter member 346a can be achieved.

(Pressure Reducing and Temperature Increasing Step (S20))

Subsequently, the open/close valve 241g and the open/close valve 241h are closed, to thereby exhaust the inside of the processing chamber 201 by the vacuum pump 231b, so that the inside of the processing chamber 201 is set to a desired pressure (degree of vacuum) (S20). At this time, the pressure in the processing chamber 201 is measured by the pressure sensor 245, and based on the measured pressure, the opening degree of the APC valve 231a is feedback-controlled. Further, the inside of the processing chamber 201 is heated by the heater 207 so as to be set to a desired temperature (S20). At this time, power supply state to the heater 207 is feedback-controlled based on temperature information detected by the temperature sensor. Moreover, the upstream side of the gas introducing nozzle 325 and the inside of the vaporized gas supply tube 240a, being the vaporized gas supply route, are heated by the piping heater 238a, so as to be a prescribed temperature or more. Then, the boat 217 is rotated by the rotation mechanism 267 to rotate the wafer 200.

(Film Forming Step (S30))

Subsequently, the film forming step (S30) is executed. In the film forming step (S30), the step of supplying the vaporized gas onto the wafer 200 (S31), the step of purging the inside of the processing chamber 201 (S32), the step of supplying the reactive gas onto the wafer 200 (S33), and the step of purging the inside of the processing chamber 201, are set as one cycle, and this cycle is executed prescribed number of times.

In the step of supplying the vaporized gas (S31), the open/close valve 241d is opened, to supply the pressurized gas into the liquid source supply tank 266. Then, the open/close valves 243c, 241c are opened, and the liquid source (organic compounds such as TEMAH and TEMAZ) in the liquid source supply tank 266 is sent to the evaporation space under pressure. Then, the evaporation space is heated by the energizing heating heater, to a prescribed temperature atmosphere (for example, 120° C. to 150° C.) and the liquid source supplied to the evaporation space is vaporized to generate the vaporized gas (source gas). Further, the open/close valve 241f is opened, to supply the carrier gas to the vaporizer 260. The open/close valve 241a is closed until the vaporized gas is stably generated, and the open/close valve 241i is opened, to thereby discharge the mixed gas of the vaporized gas and the carrier gas from the vaporized gas vent tube 240i. When the vaporized gas is stably generated, the open/close valve 241i is closed, and the open/close valve 241a is opened, to thereby supply the mixed gas of the vaporized gas and the carrier gas into the processing chamber 201. As a result, the mixed gas is supplied between the stacked wafers 200, and gas molecules of the vaporized gas are adsorbed on the surface of the wafer 200. After elapse of a prescribed time of supplying the mixed gas, the supply of the mixed gas into the processing chamber 201 is stopped while continuing the generation of the vaporized gas with the open/close valve 241a closed and the open/close valve 241i opened.

In the step of purging the inside of the processing chamber 201 (S32), the open/close valve 241g is opened to supply the purge gas into the processing chamber 201, and the discharge of the vaporized gas from the processing chamber 201 is prompted. When the atmosphere in the processing chamber 201 is purged with gas, the open/close valve 241g is closed, to stop the supply of the purge gas into the processing chamber 201.

In the step of supplying the reactive gas onto the wafer 200 (S33), the open/close valve 241e is opened to supply the oxygen gas to the ozonizer 270, and ozone gas is generated as the reactive gas. The reactive gas is discharged from the reactive gas vent tube 240j, with the open/close valve 241b closed and the open/close valve 241j opened, until the reactive gas is stably generated. When the reactive gas is stably generated, the reactive gas is supplied into the processing chamber 201, with the open/close valve 241j closed and the open/close valve 241b opened. As a result, the reactive gas is supplied between the stacked wafers 200, and a chemical reaction is caused between the gas molecules of the vaporized gas adsorbed on the surface of the wafer 200, and the reactive gas. Then, the high dielectric constant film (High-k film) containing Hf element and Zr element, from one atomic layer to several atomic layers, is generated on the surface of the wafer 200. When the supply of the reactive gas is continued for a prescribed time, the supply of the reactive gas into the processing chamber 201 is stopped, while the generation of the reactive gas is continued with the open/close valve 241b closed and the open/close valve 241j opened.

In the step of purging the inside of the processing chamber 201 (S34), the purge gas is supplied into the processing chamber 201 by opening the open/close valve 241h, and the discharge of the reactive gas and a reaction product from the processing chamber 201 is prompted. When the atmosphere in the processing chamber 201 is replaced with the purge gas, the open/close valve 241h is closed, to stop the supply of the purge gas into the processing chamber 201.

As described above, the step of supplying the vaporized gas onto the wafer 200 (S31) to the step of purging the inside of the processing chamber 201 (S34) is set as one cycle, and by executing this cycle prescribed number of times, the high dielectric constant film of a prescribed thickness is formed on the wafer 200, and the film forming step (S30) is ended. Note that when the film forming step (S30) is ended, the supply of the purge gas into the processing chamber 201 is continued, with the open/close valve 241g and the open/close valve 241h opened. Namely, the purge gas is continued to be supplied into the gas introducing nozzle 325 and the gas rectifier nozzle 347.

Note that in the conventional CVD (Chemical Vapor Deposition) method and the ALD (Atomic Layer Deposition) method, for example, in a case of the CVD method, a plurality of kinds of gases containing a plurality of elements constituting the formed film are simultaneously supplied, and in a case of the ALD method, a plurality of kinds of gases containing a plurality of elements constituting the formed film are alternately supplied. Then, for example a $SiO_2$ film and a $Si_3N_4$ film are formed by controlling supply conditions such as temperature, pressure, gas flow rate, time, plasma power during supply of the gas. In such a technique, for example, the supply conditions are controlled, so that a composition ratio of the film is expressed by O/Si≈2 as stoichiometric composition when the $SiO_2$ film is formed, and the composition ratio of the film is expressed by N/Si≈1.33 as the stoichiometric composition when the $Si_3N_4$ film is formed.

Meanwhile, according to the embodiments of the present invention, the supply conditions are controlled, so that the composition ratio of the formed film is a prescribed composition ratio different from the stoichiometric composition. Namely, the supply conditions may be controlled so as to perform film formation while controlling the ratio of a plurality of elements constituting the formed film, namely, the composition ratio of the film so that at least one element of a plurality of elements constituting the formed film is more excess or insufficient than other element with respect to the stoichiometric composition.

For example, the temperature, pressure, gas supply flow rate, or gas supply time in a processing vessel in the step of forming a layer containing one of the first element and the second element, is set to be greater or longer than the temperature, pressure, gas supply flow rate, or gas supply time in the processing vessel in the step of forming one of the layers in a case of forming a thin film having the stoichiometric composition. Alternatively, the temperature, pressure, gas supply flow rate, or gas supply time of the processing vessel in the step of forming the other layer containing the other element of the first element and the second element, is set to be smaller or shorter than the temperature, pressure, gas supply flow rate, or gas supply time in the processing vessel in the step of forming the other layer in a case of forming the thin film having the stoichiometric composition.

Thus, the thin film is formed having the composition in which one of the elements is more excessive than the other element, with respect to the stoichiometric composition.

(Pressure Increasing Step (S40) and Substrate Unloading Step (S50))

Subsequently, the opening degree of the APC valve 231a is set to be small, and by opening the open/close valve 241g and the open/close valve 241h, the purge gas is supplied into the processing chamber 201 until the pressure in the processing chamber 201 reaches the atmospheric pressure (S40). Then, by a reversed procedure to the substrate loading step (S10), the wafer 200 after film formation is unloaded from the processing chamber 201 (S50). In the substrate unloading step (S50), preferably the open/close valve 241g and the open/close valve 241h are opened, to continue the supply of the purge gas into the processing chamber 201.

(Filter Exchange Step (S60))

As described above, when the steps S10 to S50 are executed, carbide is remained in the vaporizer 260, and a by-product including impurities of the vaporized gas, for example, oxide of the vaporized gas is formed in the vaporized gas supply tube 240a connecting the inside of the vaporizer 260 and the inside of the processing chamber 201. The carbide and the oxide generated in the vaporizer 260 and the vaporized gas supply tube 240a are trapped by the filter 346 (filter member 346a), to thereby inhibit the diffusion of the particles into the processing chamber 201. However, when the steps S10 to S50 are repeatedly executed, clogging of the filter member 346a occurs due to the trapped carbide and the oxide, resulting in decrease of the flow rate of the vaporized gas supplied into the processing chamber 201 in some cases. Therefore, in this embodiment, the step of exchanging the filter 346 (filter member 346a) (S60) is regularly executed.

In the step of exchanging the filter (S60), first, the open/close valves 241a and 241b are closed, and the seal cap 219 is descended. Then, the fastening cap 356 is loosened, to pull-out the gas rectifier nozzle 347 from the gas introducing nozzle 325, to thereby expose the filter 346. Then, the filter 346 (or the filter member 346a) is exchanged, and the gas rectifier nozzle 347 is engaged with the upper end of the gas introducing nozzle 325 again, to fasten the fastening cap 356 and fix the gas rectifier nozzle 347 to the gas introducing nozzle 325. Note that the open/close valve 241g is opened while the seal cap 219 is descended, and the inside of the processing chamber 201, the inside of the vaporized gas supply tube 240a, and the inside of the vaporized gas nozzle 233a are purged with purge gas, and the invasion of the atmosphere into the processing chamber 201 (adhesion of the moisture to the inner wall thereof) and the vaporized gas supply route (into the vaporized gas supply tube 240a and the vaporized gas nozzle 233a) is inhibited.

(6) Effect of this Embodiment

According to this embodiment, one or a plurality of effects is exhibited as shown below.

(a) According to this embodiment, the metal cylindrical part 346b and the filter member 346a are provided to inside of the gas rectifier nozzle 347, so that the surface of the filter member 346a is not directly exposed in the inside of the processing chamber 201. Thus, when the film forming step (S30) as will be described later is executed, formation of the thin film on the surface of the filter member 346a can be inhibited, and the generation of the particles and the clogging of the filter members 346a can be inhibited.

(b) According to this embodiment, a gap is provided between the vaporized gas supply hole 248a formed on the cylindrical part of the gas rectifier nozzle 347 and the filter member 346a. Specifically, the filter member 346a is disposed lower than the vaporized gas supply hole 248a. Thus, the surface of the filter member 346a can be inhibited from being brought into contact with the atmosphere in the processing chamber 201. Then, when the film forming step (S30) as will be described later is executed, the formation of the thin film on the surface of the filter member 346a can be inhibited, and the generation of the particles and the clogging of the filter member 346a can be inhibited.

(c) According to this embodiment, specifically the filter member 346a is disposed outside of the processing area of the wafer 200 in the processing chamber 201 (area where the wafer 200 is held by the boat 217), specifically lower than the processing area. Thus, the temperature of the filter member 346a can be set to be lower than the temperature for thermally decomposing the vaporized gas. Thus, thermal decomposition of the vaporized gas supplied to the filter member 346a can be inhibited, then the clogging of the filter member 346a can be inhibited, and the long service life of the filter member 346a can be achieved. Note that by disposing the filter member 346a at a position where the temperature is higher than a vapor pressure temperature of the vaporized gas, the reliquefaction of the vaporized gas can be inhibited without providing an exclusive heating device.

Figure 6:
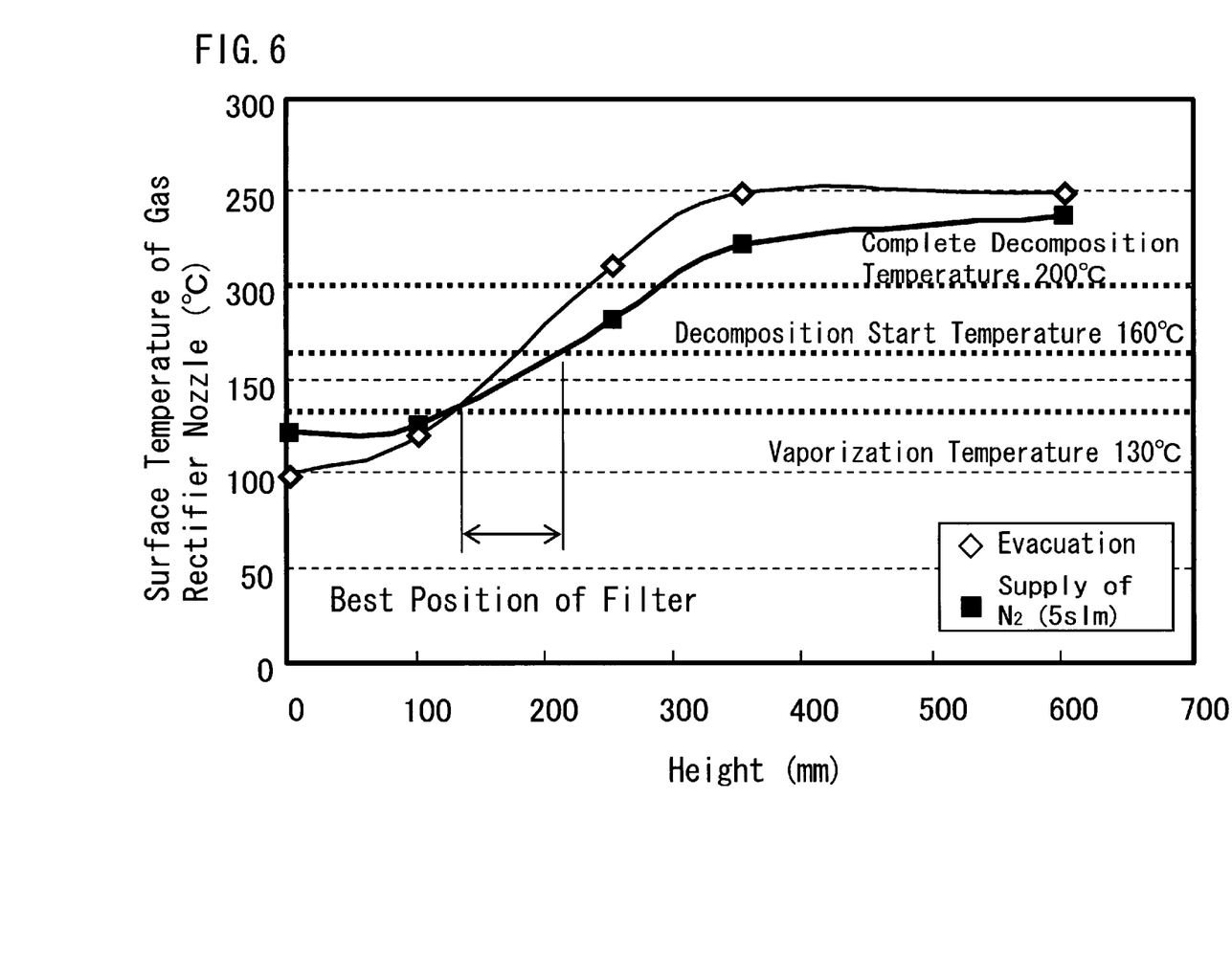
FIG. 6 is a graph showing measurement results of a temperature distribution in a processing chamber according to an embodiment of the present invention.

FIG. 6 is a graph view showing a measurement result of a temperature distribution in the processing chamber 201. The horizontal axis of FIG. 6 shows a height position (mm) in the processing chamber, and the vertical axis shows the temperature measured by thermocouple installed on the side face of the gas introducing nozzle 325, namely a surface temperature (° C.) of the gas introducing nozzle 325. ◇ in the figure shows a case of vacuum-exhausting the inside of the processing chamber 201, and ■ shows a case of introducing nitrogen gas, with the flow rate of 5 slm, into the processing chamber 201 respectively. In an example shown in FIG. 6, it is found that by disposing the filter member 346a in a height range (about 120 mm to 210 mm) shown as "best position of filter" in the figure, thermal decomposition can be inhibited while preventing the reliquefaction of the vaporized gas supplied to the filter member 346a.

(d) According to this embodiment, the connection part between the gas introducing nozzle 325 and the gas rectifier nozzle 347 is provided in the processing chamber 201. Then, the filter 346 is provided to inside of the gas rectifier nozzle 347, at the connection part between the gas introducing nozzle 325 and the gas rectifier nozzle 347. Namely, the exchange of the filter 346 can be performed within the processing chamber 201. As a result, the inside of the vaporized gas supply route can be prevented from being exposed to the atmosphere when the filter 346 is exchanged, then the adhesion of moisture to the inner wall thereof can be inhibited, and the generation of the particles due to a reaction between the moisture and the organic compound can be inhibited. Further, with the exchange of the filter 346, the exchange of the piping member, etc, constituting the vaporized gas supply system and the installation/removal of the piping heater 238a can be eliminated, thus making it possible to reduce the time required for the exchange work of the filter 346, and reduce the cost required for the exchange. Further, the generation of the particles can be inhibited, thus making it possible to reduce a frequency of exchanging the filter 346, and reduce a substrate processing cost.

Figure 5:
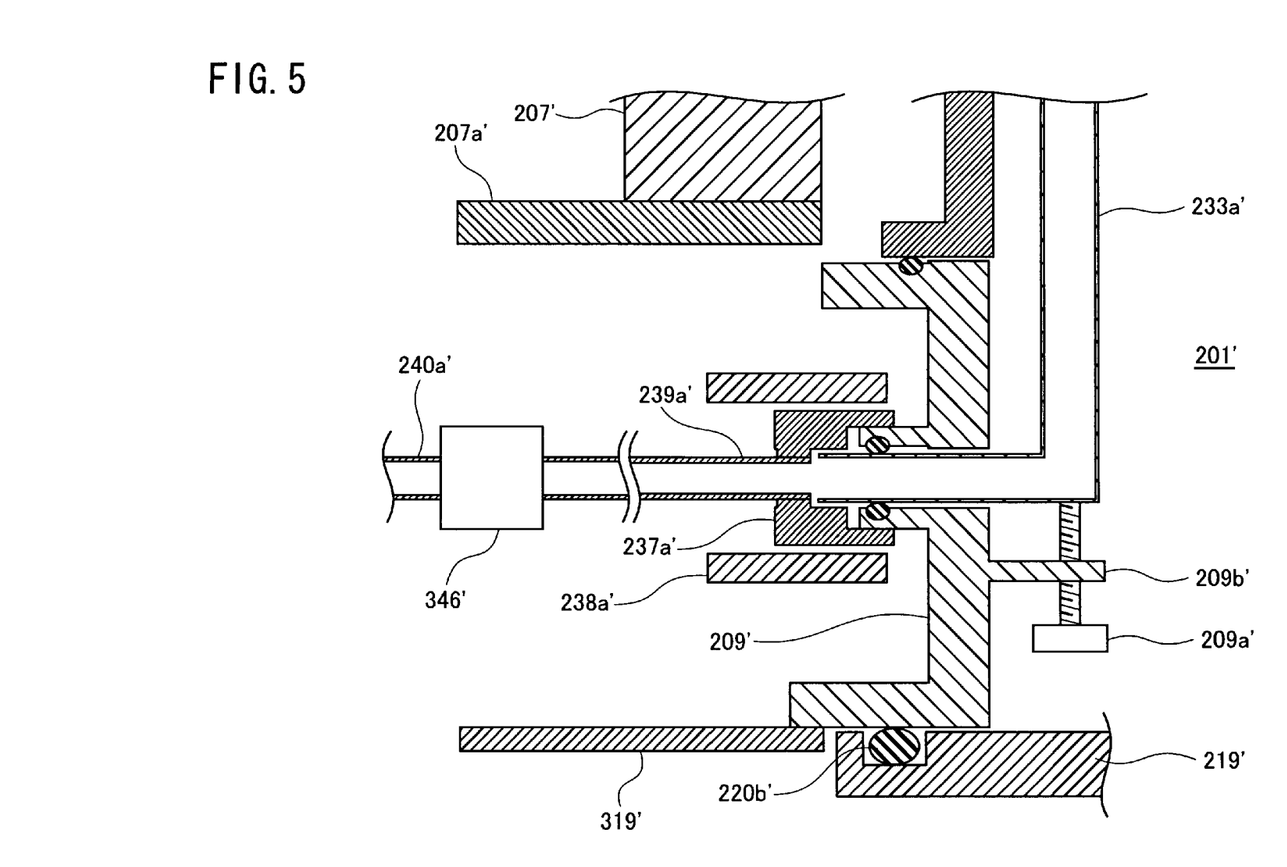
FIG. 5 is a partial expanded view of a conventional vaporized gas nozzle and its periphery.

The structure of the periphery of the gas supply part in the conventional substrate processing apparatus is shown in FIG. 5. As shown in FIG. 5, a filter 346' in the conventional substrate processing apparatus is provided not in a processing chamber 201', but in a vaporized gas supply tube 240a' (outside the processing chamber 201'). Therefore, when the filter 346' is exchanged, the inside of the vaporized gas supply tube 240a' and the inside of the vaporized gas supply nozzle 233a' are exposed to the atmosphere. As a result, with the exchange of the filter 346', a part of the piping member, etc, exposed to the atmosphere needs to be exchanged simultaneously, and further the installment/removal of the heating heater 238', etc, needs to be performed simultaneously. As a result, the time is required for the exchange work of the filter, and the cost required for the exchange is increased. Meanwhile, according to the substrate processing apparatus of this embodiment in which the filter 346 is provided in the processing chamber 201, the exchange time of the filter can be shortened to, for example, about ⅓, compared with the substrate processing apparatus exemplified in FIG. 5, and the exchange cost can be reduced to, for example, about ½.

(e) According to this embodiment, after the substrate loading step (S10) and the film forming step (S30) are executed, in the substrate unloading step (S50) and the filter exchange step (S60), the purge gas is continuously supplied to the inside of the gas introducing nozzle 325, the inside of the gas rectifier nozzle 347, and the inside of the processing chamber 201, by opening the open/close valve 241g and the open/close valve 241h. Thus, the invasion of the atmosphere into the processing chamber 201 can be effectively inhibited. Further, the atmosphere in the processing chamber 201 and the atmosphere that invades into the processing chamber 201 are prevented from flowing backward to the inside of the gas rectifier nozzle 347 and the inside of the gas introducing nozzle 325, and the inside of the vaporized gas supply tube 240a, through the vaporized gas supply hole 248a. Then, the contamination of the filter member 346a can be inhibited, and the generation of the particles and the clogging of the filter member 346a can be inhibited. Further, the deterioration of the filter member 346a can be inhibited, and the long service life of the filter member 346a can be achieved.

(f) According to this embodiment, the tip end part of the gas rectifier nozzle 347 is formed as an attachment port of the filter 346. Therefore, the attachment and positioning of the filter 346 can be easily performed with good reproducibility.

(g) According to this embodiment, the filter 346 is provided to the inside of the processing chamber 201 (at a place close to the wafer 200). Namely, the particles are trapped at a position close to the wafer 200, and the supply route of the reactive gas on the downstream side of the filter 346 is shortened as much as possible. Thus, a reduction effect of the particles is increased. Meanwhile, in the conventional substrate processing apparatus as shown in FIG. 5, the filter 346' is provided outside of the processing chamber 201', and the supply route of the reactive gas on the downstream side of the filter 346' is relatively long. Therefore, the amount of the particles diffused into the processing chamber 201' is easily more increased than the particles diffused into the processing chamber 201 in this embodiment.

(h) According to this embodiment, the flow resistance of the vaporized gas between the inner wall of the gas rectifier nozzle 347 and the outer wall of the filter 346 is reduced, by adjusting the inner diameter of the gas rectifier nozzle 347 with respect to the maximum outer diameter of the filter 346, then sufficient flow rate of the vaporized gas supplied to the inside of the processing chamber 201 can be secured, and therefore the vaporized gas can be supplied into the processing chamber 201 smoothly. For example, sufficient flow rate of the vaporized gas supplied into the processing chamber 201 can be secured, by making the inner diameter of the gas rectifier nozzle 347 greater than the maximum outer diameter of the filter 346 by 3 mm or more.

(i) According to this embodiment, the source gas vaporized by the vaporizer 260 can be supplied as the vaporized gas, with the pressure kept to be not higher than the vaporization pressure of the source, and therefore sufficient flow rate of the vaporized gas supplied into the processing chamber 201 can be secured. For example, sufficient flow rate of the vaporized gas supplied into the processing chamber 201 can be secured by increasing the length and diameter of the filter member 346a and increasing the surface area (or volume) of the filter member 346a. Further, a pressure loss is prevented from being greater when the source gas of great flow rate is flown, by adjusting the surface area (or volume) of the filter member 346a, and the vaporized gas can be stably supplied into the processing chamber 201 irrespective of the supply amount of the gas, and the generation of the by-product of the vaporized gas including impurities can be inhibited, and therefore an exchange cycle of the filter 346 can be adjusted.

(j) According to this embodiment, the filter 346 can be easily exposed by pulling-out the gas rectifier nozzle 347 from the gas introducing nozzle 325 by loosening the fastening cap 356, with the seal cap 219 descended. Therefore, a contamination state of the filter 346 (clogging state) can be easily confirmed.

(j) The vaporized gas supply tube 240a of this embodiment can be formed of a flexible tube having flexibility. By forming it by the flexible tube, the installment/removal of the vaporized gas supply tube 240a can be easily performed during maintenance operation. However, when the vaporized gas supply tube 240a is excessively bent, by-products including impurities of the vaporized gas stuck to the inner wall is peeled-off, thus possibly causing an increase of the particles in the processing chamber 201. According to this embodiment, the filter 346 is provided on the downstream side of the vaporized gas supply tube 240a, and therefore even when the vaporized gas supply tube 240a is formed of the flexible tube, the invasion of the particles formed of the by-products including the impurities into the processing chamber 201 can be inhibited.

Other Embodiment of the Present Invention

Figure 7:
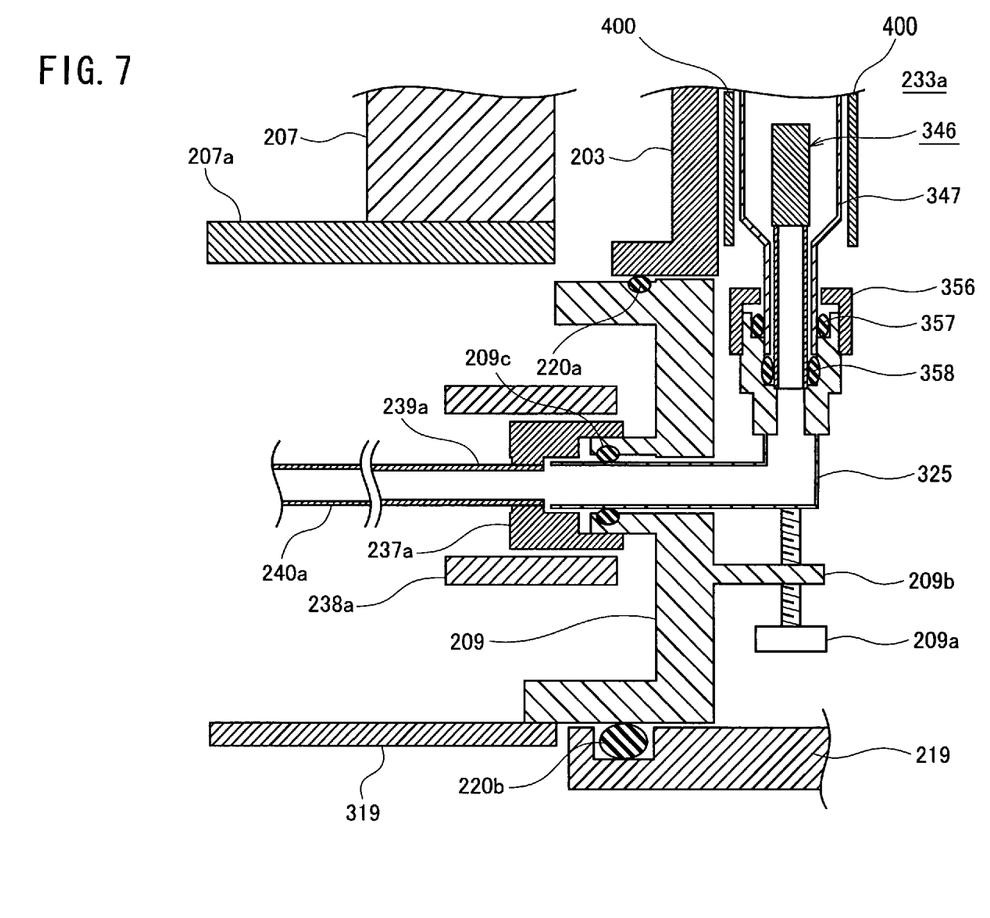
FIG. 7 is a partial expanded view of a vaporized gas nozzle and its periphery according to other embodiment of the present invention.

The substrate processing apparatus according to this embodiment is different from the above-described embodiment, in the point that a masking shield 400 is provided, being a shielding part for shielding a heat radiation to the filter 346 from the heater 207. FIG. 7 is a partial expanded view of the vaporized gas nozzle and its periphery according to this embodiment. As shown in FIG. 7, the masking shield 400 is provided between the heater 207 and the filter 346.

According to this embodiment, an influence by a direct heat radiation from the heater 207 can be inhibited, and the deterioration, etc, of the filter member 346a can be inhibited. For example, by providing the masking shield 400, the temperature of the filter member 346a can be set to be lower than the temperature for thermally decomposing the vaporized gas. Then, the thermal decomposition of the vaporized gas supplied to the filter member 346a can be inhibited, and the clogging of the filter member 346a can be inhibited, and also the long service life of the filter member 346a can be achieved. Note that the shape, size, position, and material of the masking shield 400 are suitably adjusted according to the position of the filter member 346a, output of the heater 207, and the kind of the vaporized gas. Further, by adjusting the shape, size, position, and material of the masking shield 400, the temperature of the filter member 346a can be set to be not less than the vapor pressure temperature of the vaporized gas, and the reliquefaction of the vaporized gas can be inhibited without providing an exclusive heating device. Thus, energy saving of the periphery of the gas rectifier nozzle 347 can be achieved. Further, the structure of the substrate processing apparatus and the increase of the components can be suppressed.

Note that the masking shield 400 is preferably provided not only between the heater 207 and the filter 346, but also between the processing area of the wafer 200 and the filter 346. Thus, an influence by indirect heat radiation from the wafer 200 and the member in the processing chamber 201 heated by the heater 207 can be inhibited, and the deterioration of the filter member 346 can be inhibited.

As a modified example of this embodiment, the shielding part may be constituted as a part of the gas supply nozzle including opaque quartz provided between the heater 207 and the filter 346. Namely, the gas rectifier nozzle 347 provided so as to surround the outer periphery of the filter member 346a may be made of opaque quartz and may be used as the aforementioned shielding part. By making a part between the heater 207 and the filter member 346a in the gas rectifier nozzle 347 by opaque quartz, an influence by direct heat radiation from the heater 207 can be inhibited. Further, by making the processing area of the wafer 200 and the filter 346 in the gas rectifier nozzle 347 by opaque quartz, the influence by indirect heat radiation from the wafer 200 and the member in the processing chamber 201 heated by the heater 207 can be inhibited. According to this modified example, there is no necessity for providing the exclusive shielding part such as the masking shield 400 in the periphery of the gas rectifier nozzle 347, and therefore further energy saving around the gas rectifier nozzle 347 can be achieved, and further the increase of the constituent components of the substrate processing apparatus can be suppressed.

Further Other Embodiment of the Present Invention

For example, in the above-described embodiment, explanation is given for a case of executing the ALD method of alternately supplying the vaporized gas and the reactive gas onto the wafer 200. However, the present invention is not limited thereto. Namely, as long as the vaporized gas generated by vaporizing the liquid source is used, the present invention can be suitably applied to a case of executing other method such as CVD (Chemical Vapor Deposition) method. Further, the present invention is not limited to a case of forming the high dielectric constant film, and can be suitably applied to the substrate processing apparatus of forming other films such as a nitride film, an oxide film, a metal film, and a semiconductor film.

Further, the vaporized gas nozzle 233a of the aforementioned embodiment is made so as to be divided into the gas introducing nozzle 325 and the gas rectifier nozzle 347. However, the present invention is not limited thereto. Namely, in the vaporized gas nozzle 233a, the gas introducing nozzle 325 and the gas rectifier nozzle 347 may be integrally and non-separately formed. With this structure, the number of components can be reduced, and the manufacturing cost and a maintenance man-hour of the substrate processing apparatus can be reduced.

Further, the filter 346 of the aforementioned embodiment can be made detachable from the vaporized gas nozzle 233a. However, the present invention is not limited thereto. For example, the filter 346 and the vaporized gas nozzle 233a may be integrally and non-separately formed.

Further, the vaporized gas nozzle 233 of the aforementioned embodiment is formed so that the vaporized gas is supplied independently. However, the present invention is not limited thereto. For example, it is also acceptable that the vaporized gas and other one kind or more gases are mixed on the upstream side of the vaporized gas nozzle 233.

As described above, embodiments of the present invention are specifically described. However, the present invention is not limited to the aforementioned embodiments, and can be variously modified in a range not departing from the gist of the present invention.

Preferred Aspects of the Present Invention

Preferred aspects of the present invention will be additionally described hereafter.

According to an aspect of the present invention, a substrate processing apparatus is provided, comprising:
a processing chamber processing substrates; and
a gas supply part supplying processing gas into the processing chamber,
wherein the gas supply part comprises:
a gas supply nozzle disposed in the processing chamber;
a filter disposed in the gas supply nozzle, for removing impurities contained in the processing gas; and
a gas supply port opened on the gas supply nozzle, for supplying into the processing chamber, the processing gas from which the impurities are removed by the filter.

Preferably, a gap is provided between the filter and the gas supply port.

Further preferably, the filter has
a cylindrical part disposed in the gas supply nozzle; and
a filter member disposed in the gas supply nozzle and connected to a downstream side of the cylindrical part,
wherein an upstream end of the cylindrical part is airtightly connected to the gas supply nozzle.

Further preferably, a gap is provided between an inner wall of the gas supply nozzle and an outer wall of the filter member.

Further preferably, a gap of 3 mm or more is provided between the inner wall of the gas supply nozzle and the outer wall of the filter member.

Further preferably, the processing gas includes a vaporized gas.

Further preferably, a surface area or volume of the filter member is set according to an introduction amount of the processing gas supplied into the processing chamber.

Further preferably, the gas supply nozzle has a gas introducing nozzle and a gas rectifier nozzle connected to a downstream side of the gas introducing nozzle, and a connection part between the gas introducing nozzle and the gas supply nozzle is provided in the processing chamber, so that the filter can be exchanged in the processing chamber.

Further preferably, a heating mechanism heating a processing area of the substrate is provided in the processing chamber, and the filter is disposed outside of the processing area.

Further preferably, a heating mechanism heating a processing area of the substrate is provided in the processing chamber, and a shielding part shielding a heat radiation to the filter from the heating part is provided.

Further preferably, the shielding part is a masking shield provided between the heating part and the filter.

Further preferably, the substrate processing apparatus is provided, comprising:
a processing chamber processing substrates;
a loading/unloading part loading and unloading at least one of the substrates into/outside the processing chamber; and
a gas supply part introducing at least one kind of processing gas into the processing chamber.
wherein the gas supply part has
a gas supply nozzle disposed in the processing chamber;
a filter disposed in the gas supply nozzle, for removing impurities contained in the processing gas; and
a gas supply port opened in a part of the gas supply nozzle, for supplying into the processing chamber, the processing gas from which the impurities are removed by the filter.

Further preferably, the shielding part is formed as a part of the gas supply nozzle containing opaque quartz, provided between the heating part and the filter.

According to other aspect of the present invention, a substrate processing apparatus is provided, comprising:
a gas supply part introducing at least one kind of processing gas into a processing chamber in which substrates are stored,
wherein the gas supply part comprises:
a gas introducing nozzle disposed in the processing chamber;
a gas rectifier nozzle connected to a tip end of the gas introducing nozzle, and having a gas supply port for introducing a processing gas into the processing chamber; and
a filter disposed inside of the gas rectifier nozzle, and
the processing gas is introduced to the gas rectifier nozzle from the gas introducing nozzle through the filter, and is introduced into the processing chamber form the gas supply port.

Preferably, an inner diameter of the gas rectifier nozzle is greater than an outer diameter of the filter.

Further preferably, the processing gas is a vaporized gas generated by vaporizing a liquid source.

Further preferably, a surface area (or volume) of the filter is set according to an introduction amount of the processing gas introduced into the processing chamber.

According to further another aspect of the present invention, a substrate processing apparatus is provided, comprising:

a processing chamber processing substrates;
a loading/unloading unit for loading/unloading at least one of the substrates into/outside the processing chamber; and
a gas supply part introducing at least one kind of processing gas into the processing chamber,
wherein the gas supply part comprises:
a gas introducing nozzle introducing at least one kind of processing gas;
a gas rectifier nozzle connected to a tip end of the gas introducing nozzle and having a gas supply port for introducing the processing gas into the processing chamber; and
a filter disposed inside of the gas rectifier nozzle.

Preferably, a connection part between the gas introducing nozzle and the gas rectifier nozzle is provided in the processing chamber, so that the filter can be exchanged in the processing chamber.

What is claimed is:
1. A substrate processing apparatus, comprising:
a processing chamber in which a substrate is processed; and
a gas supply part configured to supply processing gas into the processing chamber, wherein the gas supply part comprises:
a gas supply nozzle disposed in the processing chamber;
a filter disposed in the gas supply nozzle, configured to remove impurities contained in the processing gas; and
a gas supply port opened on the gas supply nozzle, configured to supply into the processing chamber, the processing gas from which the impurities are removed by the filter, wherein the filter comprises:
a tubular part disposed in the gas supply nozzle; and
a filter member disposed in the gas supply nozzle and connected to a downstream end of the tubular part,
wherein an upstream end of the tubular part is air-tightly connected to the gas supply nozzle.

2. The substrate processing apparatus according to claim 1, wherein a gap is provided between the filter and the gas supply port.

3. The substrate processing apparatus according to claim 1, wherein a gap is provided between an inner wall of the gas supply nozzle and an outer wall of the filter member.

4. The substrate processing apparatus according to claim 1, wherein a gap of 3 mm or more is provided between an inner wall of the gas supply nozzle and an outer wall of the filter member.

5. The substrate processing apparatus according to claim 1, wherein the processing gas includes a gas generated by vaporizing a liquid source.

6. The substrate processing apparatus according to claim 1, wherein a surface area or volume of the filter member is set according to an introduction amount of the processing gas supplied into the processing chamber.

7. The substrate processing apparatus according to claim 1, wherein the gas supply nozzle comprises:
a gas introducing nozzle; and
a gas rectifier nozzle connected to a downstream end of the gas introducing nozzle, wherein:
a connection part between the gas introducing nozzle and the gas rectifier nozzle is provided inside of the processing chamber, and
the filter can be exchanged in the processing chamber.

8. The substrate processing apparatus according to claim 1, further comprising:
a heating mechanism configured to heat a processing area of the substrate in the processing chamber,
wherein the filter is disposed outside the processing area.

9. The substrate processing apparatus according to claim 1, further comprising:
a heating mechanism configured to heat a processing area of the substrate in the processing chamber; and
a shielding part configured to shield a heat radiation to the filter from the heating mechanism.

10. The substrate processing apparatus according to claim 9, wherein the shielding part is a masking shield provided between the heating mechanism and the filter.

11. A substrate processing apparatus comprising:
a processing chamber in which a substrate is processed;
a loading/unloading part configured to load/unload at least one substrate into/outside the processing chamber; and
a gas supply part configured to introduce at least one kind of processing gas into the processing chamber, wherein the gas supply part comprises:
a gas supply nozzle disposed in the processing chamber;
a filter disposed in the gas supply nozzle, configured to remove impurities contained in the processing gas; and
a gas supply port opened in a part of the gas supply nozzle, configured to supply into the processing chamber, the processing gas from which the impurities are removed by the filter, wherein the filter comprises:
a tubular part disposed in the gas supply nozzle; and
a filter member disposed in the gas supply nozzle and connected to a downstream end of the tubular part,
wherein an upstream end of the tubular part is air-tightly connected to the gas supply nozzle.

12. The substrate processing apparatus according to claim 9, wherein the shielding part is formed as a part of the gas supply nozzle containing opaque quartz, provided between the heating mechanism and the filter.

* * * * *